United States Patent
Chen et al.

(10) Patent No.: US 8,362,580 B2
(45) Date of Patent: Jan. 29, 2013

(54) SPIN-TRANSFER SWITCHING MAGNETIC ELEMENT UTILIZING A COMPOSITE FREE LAYER COMPRISING A SUPERPARAMAGNETIC LAYER

(75) Inventors: Wei-Chuan Chen, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 214 days.

(21) Appl. No.: 12/632,952

(22) Filed: Dec. 8, 2009

(65) Prior Publication Data

US 2011/0133298 A1 Jun. 9, 2011

(51) Int. Cl.
*H01L 43/00* (2006.01)
*H01L 43/12* (2006.01)
(52) U.S. Cl. ........................ 257/421; 257/422
(58) Field of Classification Search .............. 257/295, 257/421–422, E43.001, E43.006
See application file for complete search history.

(56) References Cited

U.S. PATENT DOCUMENTS

| | | | |
|---|---|---|---|
| 2002/0191451 A1 | 12/2002 | Kishi | |
| 2004/0253437 A1 | 12/2004 | Ingvarsson | |
| 2007/0034919 A1 * | 2/2007 | Wang et al. | 257/295 |
| 2007/0159734 A1 | 7/2007 | Nguyen et al. | |
| 2007/0171694 A1 | 7/2007 | Huai et al. | |
| 2008/0191251 A1 | 8/2008 | Ranjan | |

OTHER PUBLICATIONS

Lee Kangho et al: "Effect of interlayer coupling in CoFeB/Ta/NiFe free layers on the critical switching current of MgO-based magnetic tunnel junctions", Journal of Applied Physics, American Institute of Physics. New York, US, vol. 106, No. 2, Jul. 29, 2009, pp. 24513-24513, XP012123656, ISSN: 0021-8979, DOI:10.1063/1.3184423.
Written Opinion, International Search Report—PCT/US2010/059527, International Search Authority—European Patent Office Mar. 16, 2011.

* cited by examiner

*Primary Examiner* — Cuong Q Nguyen
(74) *Attorney, Agent, or Firm* — Sam Talpalatsky; Nicholas J. Pauley; Jonathan T. Velasco

(57) ABSTRACT

A system and method for forming a magnetic tunnel junction (MTJ) storage element utilizes a composite free layer structure. The MTJ element includes a stack comprising a pinned layer, a barrier layer, and a composite free layer. The composite free layer includes a first free layer, a superparamagnetic layer and a nonmagnetic spacer layer interspersed between the first free layer and the superparamagnetic layer. A thickness of the spacer layer controls a manner of magnetic coupling between the first free layer and the superparamagnetic layer.

52 Claims, 7 Drawing Sheets

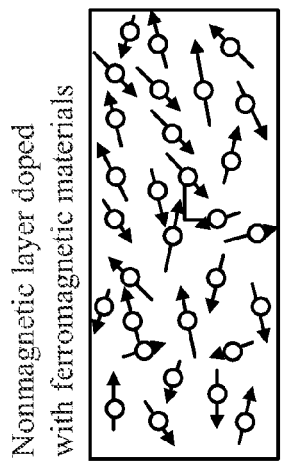
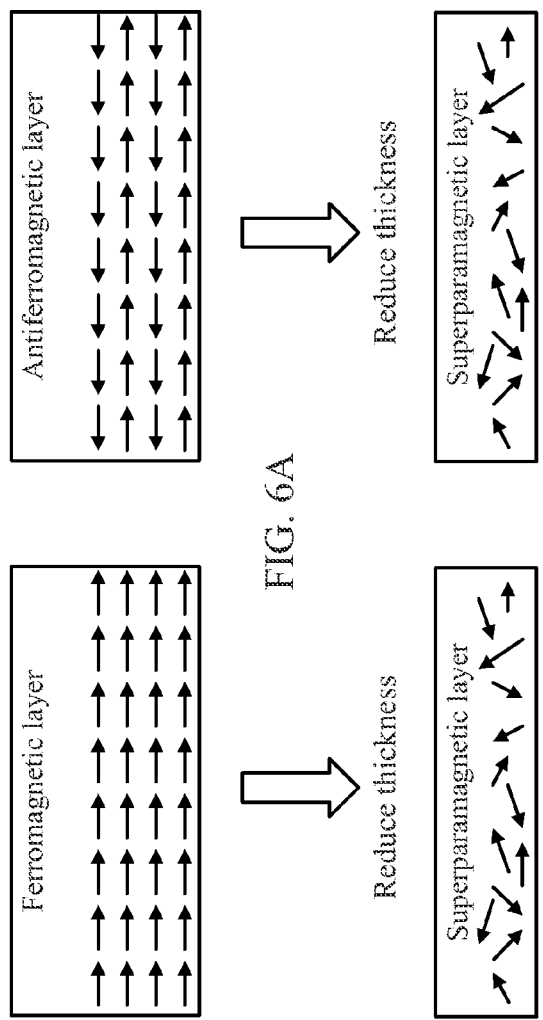
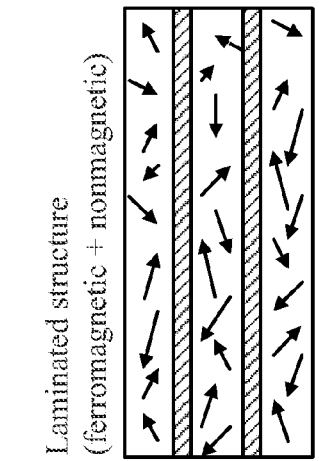
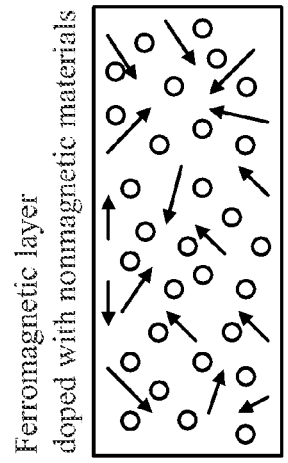

SPIN-TRANSFER SWITCHING MAGNETIC ELEMENT UTILIZING A COMPOSITE FREE LAYER COMPRISING A SUPERPARAMAGNETIC LAYER

FIELD OF DISCLOSURE

Disclosed embodiments are related to employing a composite free layer comprising a superparamagnetic layer in a Magnetic Tunnel Junction (MTJ) storage element usable in a Spin Transfer Torque Magnetoresistive Random Access Memory (STT-MRAM) cell.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

FIG. 1 illustrates a conventional STT-MRAM bit cell 100. The STT-MRAM bit cell 100 includes magnetic tunnel junction (MTJ) storage element 105, a transistor 101, a bit line 102 and a word line 103. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned (parallel) or opposite (anti-parallel). The resistance of the electrical path through the MTJ will vary depending on the alignment of the polarizations of the pinned and free layers. This variance in resistance can be used to program and read the bit cell 100. The STT-MRAM bit cell 100 also includes a source line 104, a sense amplifier 108, read/write circuitry 106 and a bit line reference 107. Those skilled in the art will appreciate the operation and construction of the memory cell 100.

For example, the bit cell 100 may be programmed such that a binary value "1" is associated with an operational state wherein the polarity of the free layer is parallel to the polarity of the pinned layer. Correspondingly, a binary value "0" may be associated with an anti-parallel orientation between the two ferromagnetic layers. A binary value may thus be written to the bit cell by changing the polarization of the free layer. A sufficient current density (typically measured in Amperes/centimeter$^2$) generated by the electrons flowing across the tunneling barrier is required to change the polarization of the free layer. The minimum current density required to switch the polarization of the free layer is also called switching current density. Decreasing the value of the switching current density leads to beneficially lowering the power consumption of the MTJ cells. Additionally, lower switching current density enables smaller device dimensions and a correspondingly higher density of MTJ cells in an STT-MRAM integrated circuit.

Existing techniques to reduce the switching current density may adversely affect the thermal stability of the MTJ cell. Accordingly, there is a need for decreasing the switching current density without impacting the thermal stability of the device.

SUMMARY

Exemplary embodiments of the invention are directed to systems and method for employing a composite free layer comprising a superparamagnetic layer in a Magnetic Tunnel Junction (MTJ) storage element usable in a Spin Transfer Torque Magnetoresistive Random Access Memory (STT-MRAM) cell.

For example, an exemplary embodiment is directed to an MTJ storage element comprising a stack comprising a pinned layer and a barrier layer; and a composite free layer formed on the barrier layer, comprising a first free layer a nonmagnetic spacer layer and a superparamagnetic layer, such that the spacer layer is interspersed between the first free layer and the superparamagnetic layer.

Another exemplary embodiment is directed to a method of forming an MTJ storage element, the method comprising forming a stack comprising a pinned layer and a barrier layer; and forming a composite free layer on top of the barrier layer comprising a first free layer, a nonmagnetic spacer layer and a superparamagnetic layer, such that the spacer layer is interspersed between the first free layer and the superparamagnetic layer.

Yet another exemplary embodiment is directed to an MTJ storage element comprising a first magnetic means for holding a first polarization; a composite magnetic means for holding a second polarization comprising ferromagnetic means; superparamagnetic means; and nonmagnetic means interspersed between the ferromagnetic means and the superparamagnetic means, wherein a thickness of the nonmagnetic means controls a manner of coupling between the ferromagnetic means and the superparamagnetic means; and insulating means interspersed between the first magnetic means and composite magnetic means to enable a flow of tunneling current between the first magnetic means and the composite magnetic means.

Another exemplary embodiment is directed to a method of forming an MTJ storage element, the method comprising step for forming a stack comprising a pinned layer and a barrier layer; and step for forming a composite free layer on top of the barrier layer comprising a first free layer, a nonmagnetic spacer layer and a superparamagnetic layer, such that the spacer layer is interspersed between the first free layer and the superparamagnetic layer.

BRIEF DESCRIPTION OF THE DRAWINGS

The accompanying drawings are presented to aid in the description of embodiments of the invention and are provided solely for illustration of the embodiments and not limitation thereof.

FIG. 6 illustrates different techniques to form an exemplary superparamagnetic layer.

DETAILED DESCRIPTION

Figure 1:
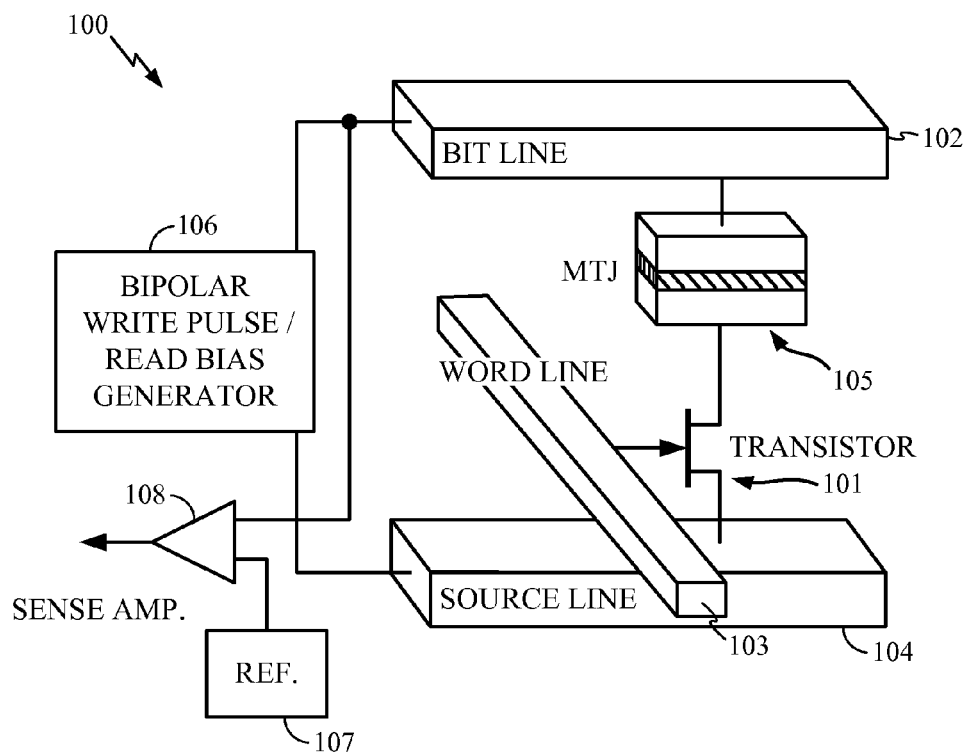
FIG. 1 illustrates a conventional Spin Transfer Torque Magnetoresistive Random Access Memory (STT-MRAM) cell array.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. The terminology used herein is for the purpose of describing particular embodiments only and is not intended to be limiting of embodiments of the invention.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The disclosed embodiments recognize that, with conventional methods, it may be difficult to decrease the switching current density of MTJ devices while maintaining their thermal stability. The physical characteristics of the ferromagnetic used in MTJ cells include a large internal magnetic field at room temperature. Reversing the polarization of ferromagnetic layers requires a relatively large current density, unless accompanied by factors such as an increased thermal energy.

Existing techniques to reduce the switching current density include the use of "spin diffusion layers", as in Huai et al., "Current-Switched Spin-Transfer Magnetic Devices with Reduced Spin-Transfer Switching Current Density", United States Patent Application Publication, Pub. No. US 2007/0171694 A1. The spin diffusion layers diffuse the electron spins outside the MTJ. As a result, the spin dependent current flowing through the MTJ may be diminished in the layers outside the free layer so that most of the spin dependent current may be confined in the magnetically active part of the MTJ stack. This may lead to a reduction of the switching current density.

Prior art techniques also include the use of low saturation magnetization materials for forming the free layer. For example, Nguyen et al., "Spin Transfer Magnetic Element Having Low Saturation Magnetization Free Layers", United States Patent Application Publication, Pub. No. US 2007/0159734 A1, which is incorporated in its entirety herein, describes techniques wherein the free layer includes ferromagnetic materials diluted with nonmagnetic materials and/or ferrimagnetically doped to provide low saturation magnetizations. Lowering the saturation magnetization of the free layer may reduce the switching current density.

Exemplary embodiments recognize that in contrast to ferromagnetic materials, the magnetization of superparamagnetic materials is significantly low at room temperature. Accordingly, a very low current density is required to reverse the polarization of a composite free layer with a superparamagnetic material at room temperature. While existing techniques include the limitations of free layers formed of ferromagnetic materials, disclosed embodiments provide techniques wherein the free layer may advantageously include superparamagnetic materials. Exemplary embodiments detail the use of superparamagnetic materials in lowering the current density while enhancing the thermal stability of the MTJ.

Figure 2:
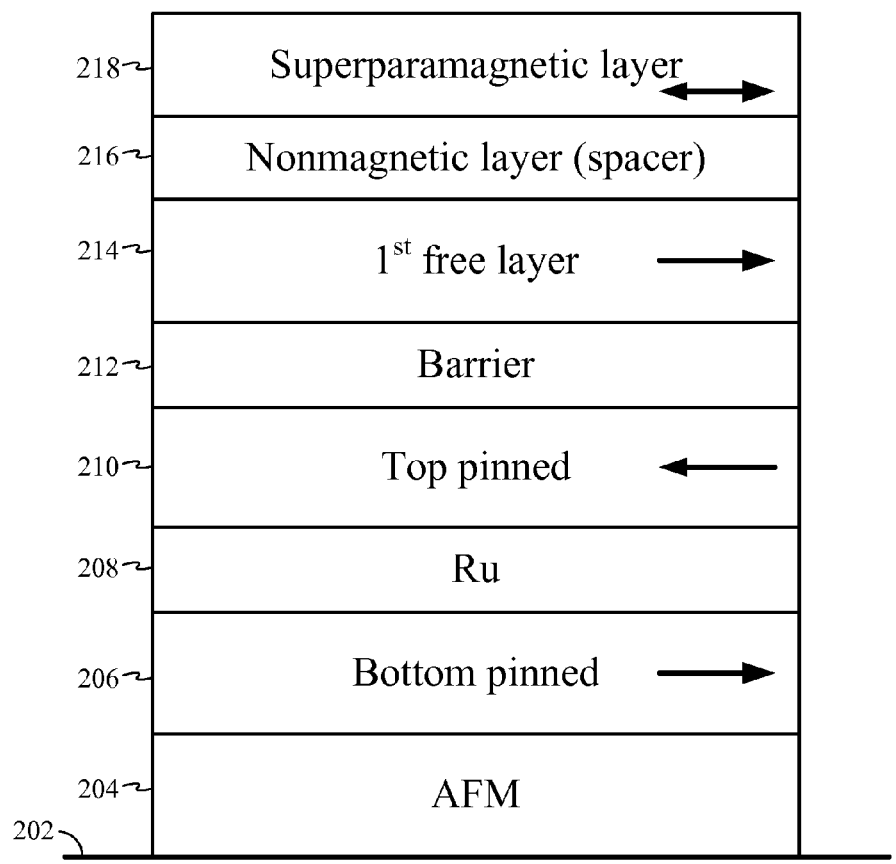
FIG. 2 illustrates an exemplary MTJ storage element utilizing a composite free layer structure comprising a superparamagnetic layer.

FIG. 2 illustrates the MTJ cell 105 according to an exemplary embodiment. An antiferromagnetic (AFM) layer 204 is first formed on a bottom electrode 202, and then a first ferromagnetic layer is formed on top of the AFM layer. The first ferromagnetic layer is "pinned" with a fixed magnetic polarization to form a pinned layer. The pinned layer may include one or more layers, such as a bottom pinned layer 206, a coupling layer 208 typically formed of a non-magnetic metal such as ruthenium, and a top pinned layer 210. Pinned layers 206, 208 and 210 may be collectively referred to as a pinned layer stack. A tunneling barrier layer 212 is formed of an insulator such as a metal oxide on top of the pinned layer. A free layer with variable magnetic polarization is formed on top of the barrier layer. The free layer may include a first free layer 214, a non-magnetic spacer layer 216 and a superparamagnetic layer 218 as shown in FIG. 2. Such a multilayered free layer structure is called a composite free layer or "synthetic" free layer. It will be appreciated that the formation of MTJ devices with synthetic free layers is well known. A top electrode (not shown) is formed on top of the free layer.

The electrons tunneling through the barrier layer 212 from the pinned layers enter the first free layer 214, causing an effect on the magnetic polarization of the first free layer 214. If switching current density is achieved, depending on the direction of spin of the majority of electrons tunneling through the barrier 212, the magnetic polarization of the first free layer may become substantially aligned (parallel) to the magnetic polarization of the pinned layers, or substantially aligned opposite (anti-parallel) to the magnetic polarization of the pinned layers. The directional arrows illustrated within the layers are merely an illustrative aid to depict an exemplary direction of polarization of the layer, and the embodiments are not limited in any manner by these illustrations. The spacer layer 216 is non-magnetic. The magnetization of the superparamagnetic layer 218 may be influenced by one of three methods.

Figures 3A, 3B:
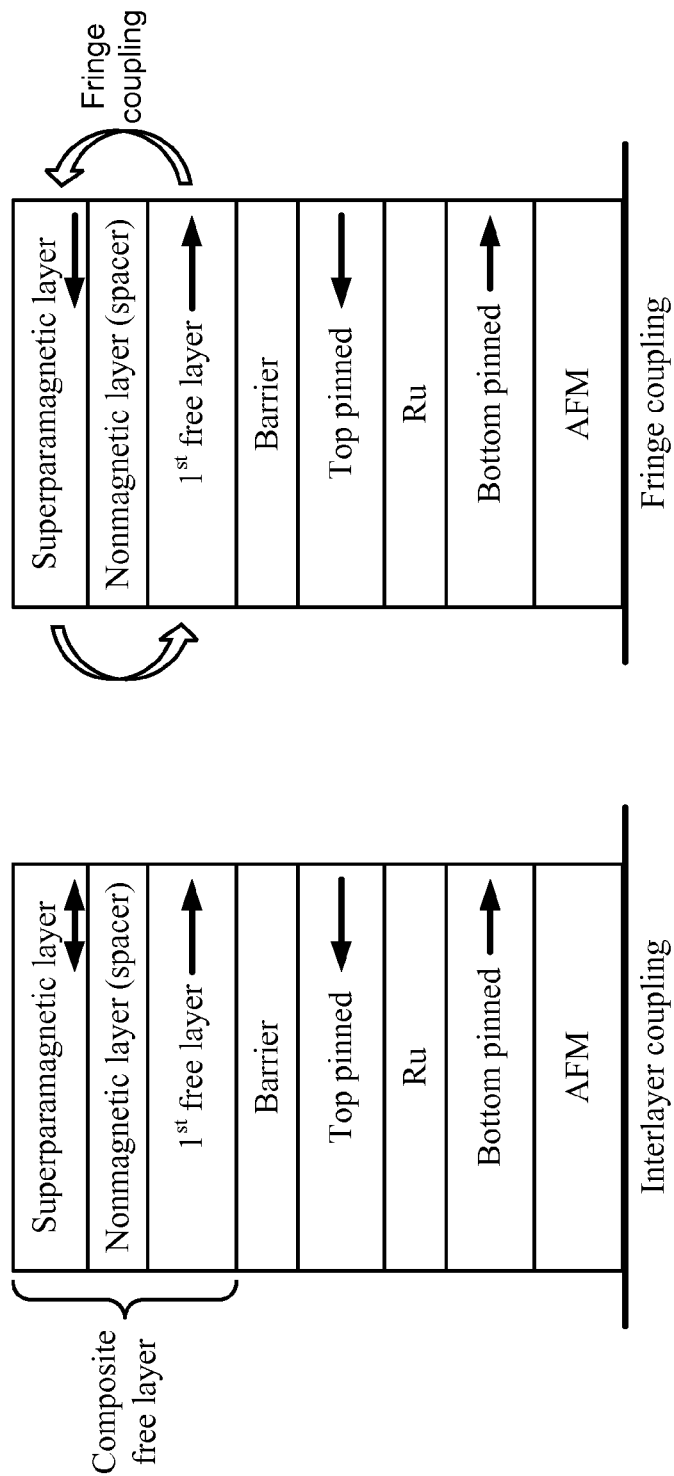
FIG. 3 illustrates different coupling effects in exemplary embodiments.

The first method of coupling the superparamagnetic layer 218 is illustrated in FIG. 3A. If the nonmagnetic spacer layer 216 is made sufficiently thin, the superparamagnetic layer 218 may become magnetically "coupled" to the first free layer 214. The magnetic polarization of the superparamagnetic layer 218 is derived from, and aligned with, the polarization of the first free layer 214 due to an exchange of energy between the two layers. This manner of coupling is called "direct interlayer coupling". The coupling strength is controlled by factors such as the thickness of the spacer layer 216.

The spacer layer 216 may be formed from a nonmagnetic material such as Ru, which leads to a second coupling mechanism known as "RKKY coupling" or "indirect interlayer coupling". In this manner of coupling, the thickness of the nonmagnetic material determines whether the coupling between the first free layer 214 and superparamagnetic layer 218 is parallel or anti-parallel.

FIG. 3B illustrates a third method of coupling between the free layers 214 and 218. If the thickness of the spacer layer 216 is increased, the interlayer coupling effect is diminished. However, the effect of fringe fields between the sidewalls of the two free layers 214 and 218 may lead to a magnetic coupling between them. This manner of coupling is usually referred to as "interlayer fringe coupling". The polarization of the superparamagnetic layer 218 is usually aligned anti-parallel to the polarization of the first free layer 214 under the effect of fringe coupling.

In the case of interlayer exchange coupling (first and second methods as described above, as shown in FIG. 3A), it is possible to achieve a strong coupling between free layers 214 and 218. The coupling strength may depend on factors which include the thickness and material of the spacer layer 216. If the spacer layer 216 is sufficiently thin, a strong coupling effect may be formed. Under a strongly coupled synthetic free layer structure, the two free layers 214 and 218 may behave as though they were one single free layer. This facilitates a "coherent" switching of the free layer. i.e., when a switching current causes the first free layer 214 to switch polarization, the coupling effect causes an instantaneous switching effect on the superparamagnetic layer 218.

The maximum polarization which can be induced in a magnetic material is called saturation magnetization. It will be understood that achieving a lower saturation magnetization will lead to lower switching current density. In the composite free layer structure with strong exchange coupling as explained above, a sufficient current density is only required to switch the first free layer 214, but the net effect is equivalent to switching both free layers 214 and 218. Moreover, a composite free layer can have a lower switching current density than a single free layer, such as 214. As described previously, existing composite free layer structures are formed from ferromagnetic materials. Hence the advantages of using a composite free layer, to achieve a lower switching current density, are limited by the inherent magnetic properties of ferromagnetic materials. However, according to an exemplary embodiment, utilizing a superparamagnetic layer 218 in a strongly coupled synthetic free layer, leads to a significantly lower switching current density.

Superparamagnetic materials are composed of small ferromagnetic clusters. But these clusters are of such small dimensions that their polarizations may flip randomly under thermal fluctuations. As a result, the net polarization of a superparamagnetic material averages out to zero in the absence of an external magnetic field. However, when an external magnetic field is applied, the superparamagnetic material becomes easily polarized, even at room temperature. On the other hand, ferromagnetic materials have an inherent non-zero polarization at room temperatures. Accordingly, reversing the polarization of ferromagnetic materials at room temperature needs a significantly greater magnetic energy, than the polarization of a superparamagnetic material.

Using a superparamagnetic material to form the superparamagnetic layer 218 in the case of strongly coupled free layers which exhibit coherent switching has various beneficial effects. For example, the coupling fields required to polarize the superparamagnetic free layer 218 are lower, which in turn leads to a stable domain structure resulting in the better uniformity of switching behavior. Exemplary embodiments use a superparamagnetic material to form the superparamagnetic layer 218 in a strongly coupled composite free layer structure, which results in lower saturation magnetization of the composite free layer and an enhancement of the spin-torque efficiency in the STT-MRAM.

Exemplary embodiments also include the use of superparamagnetic materials in the case of composite free layers which exhibit fringe coupling behavior. In contrast to the coherent switching characteristics exhibited by exchange coupling, the coupling effect in fringe coupling is weaker, and the switching behavior is more stochastic. Sometimes the fringe coupling may be so weak that it may be the equivalent of no magnetic coupling at all. In such scenarios, the composite free layer exhibits a "non-coherent" switching behavior, i.e., the first free layer 214 undergoes switching at a first point in time. Due to the extremely weak coupling behavior, the superparamagnetic layer 218 is caused to switch subsequently at a second point in time. It will be appreciated that such non-coherent switching leads to an increased spin-torque efficiency, and hence a reduced switching current density.

Figures 4A, 4B, 4C:
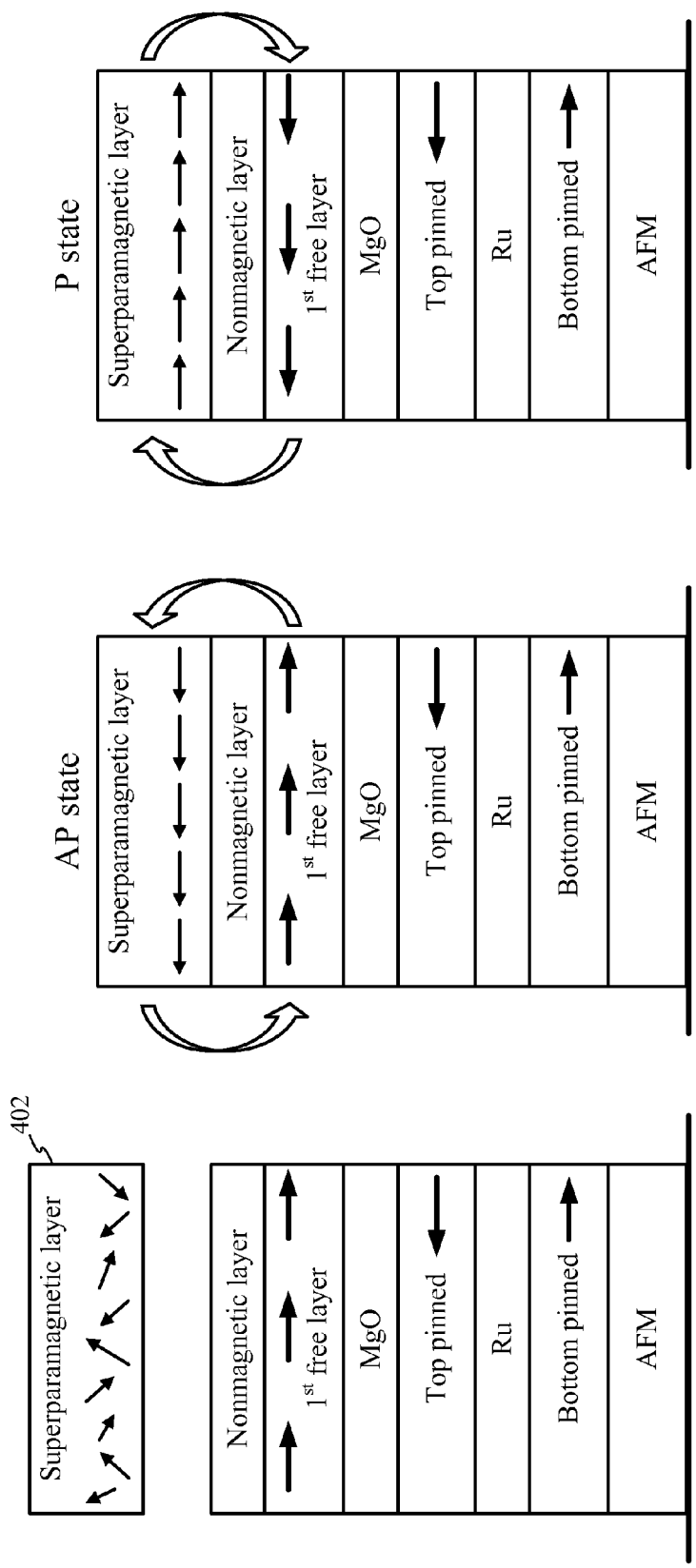
FIG. 4 illustrates interlayer fringe coupling effects in exemplary embodiments.

FIG. 4 illustrates exemplary embodiments using a superparamagnetic layer 402. FIG. 4A illustrates randomly aligned magnetic clusters in the superparamagnetic layer 402 taken in isolation. In the absence of an external magnetic field, the polarizations of the magnetic clusters cancel out, resulting in a net magnetic moment of zero. Depending on the type of coupling behavior (i.e. exchange coupling or fringe coupling), and the thickness and material of the nonmagnetic spacer layer, the superparamagnetic layer 402 may be polarized parallel or anti-parallel with respect to the first free layer 214. The first free layer 214 may itself become polarized parallel (P) or anti-parallel (AP) with respect to the top pinned layer, depending on the spin direction of the majority of electrons tunneling through the barrier layer 212.

FIG. 4B represents an exemplary embodiment wherein the first free layer 214 is polarized anti-parallel (AP) with respect to the top pinned layer 210. Fringe coupling effects in this embodiment cause the superparamagnetic layer 402 to be polarized anti-parallel to the first free layer 214. This embodiment is referred to an "AP state" of MTJ 105. FIG. 4C represents a "P state" of MTJ 105.

When the magnetic moment between a superparamagnetic layer and a first free layer is anti-parallel, the switching current density required for "P to AP" polarizations of the superparamagnetic layer 402 is effectively the same as the switching current density required for "AP to P" polarizations. The use of superparamagnetic materials to form the superparamagnetic layer 402 can result in uniform switching behavior by promoting a stable domain structure.

FIG. 5 illustrates yet another exemplary embodiment wherein the coupling mechanism between the two free layers 214 and 218 is interlayer exchange coupling. As explained previously, the superparamagnetic layer 402 may be aligned either parallel to the first free layer 214 (as illustrated in FIGS. 5A-B) or anti-parallel to the first free layer 214 (as illustrated in FIGS. 5C-D), based on the thickness and material of the nonmagnetic spacer layer 216.

Both parallel and anti-parallel alignments between the first free layer 214 and superparamagnetic layer 402 advantageously reduce the switching current density of the MTJ cell by enhancing the spin-torque efficiency and lowering the saturation magnetization of the free layer. For the parallel alignment between first free layer 214 and superparamagnetic layer 402, the increase of the spin-torque efficiency is due to the reflection of major spin electron by superparamagnetic free layer during the switching from AP to P. Spin current that comes from the barrier layer 212 enters the first free layer 214, which acts as a spin filter, changing the magnitude and direction of the spin current. This spin current is reflected back at the interface between first free layer 214 and superparamagnetic layer 402. The torque exerted by the reflected current assists the torque of the spin current entering the free layer 214, causing the free layer 214 to switch at a lower switching current density. In other words, the enhancement of the spin-torque efficiency is due to the phase difference between the first free layer 214 and superparamagnetic layer 402. The reference, Yen et al., "Reduction in critical current density for spin torque transfer switching with composite free layer", Applied Physics Letters 93, 092504 (2008), provides further details on the relationship between phase difference in composite free layer structures and the associated reflection of spin current, contributing to lower switching current density.

Figure 5A:
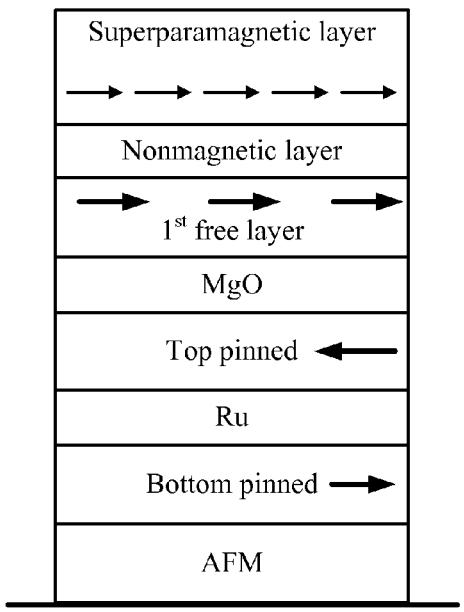
FIG. 5 illustrates interlayer exchange coupling effects in exemplary embodiments
Figure 5B:
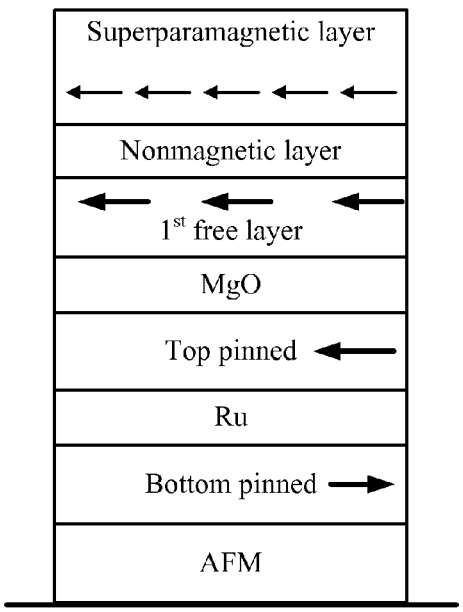
Figure 5C:
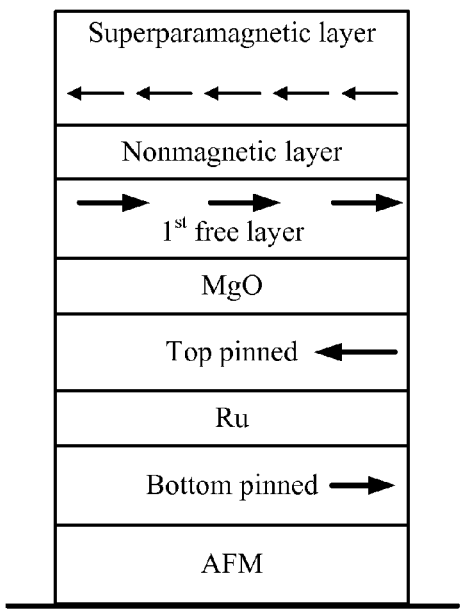
Figure 5D:
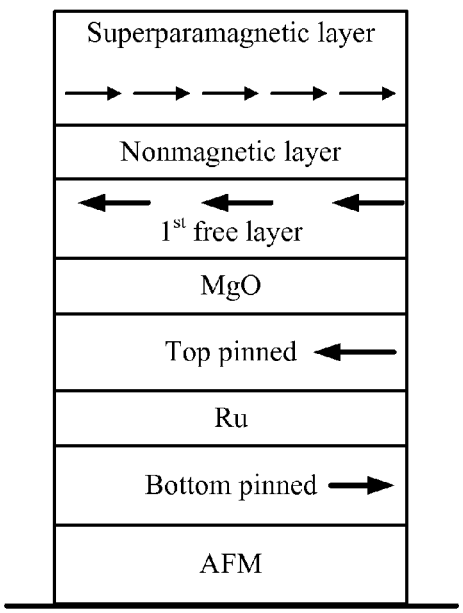

For the anti-parallel alignment between first free layer 214 and superparamagnetic layer 402, the increase of the spin-torque efficiency is due to the enhancement (polarization) of minor spin electron by superparamagnetic free layer during the switching from P to AP. In the case of anti-parallel alignment as illustrated in FIG. 5D, the minority electron spin direction contributes significantly to balancing the switching current density between the "P to AP" polarization embodiments.

Methods for forming the superparamagnetic layer 402 are well known to one of ordinary skill in the art and will not be described in detail herein. FIG. 6 illustrates a few conventional techniques for forming a superparamagnetic layer 402. FIG. 6A demonstrates a common technique wherein the thickness of a layer formed from a ferromagnetic or antiferromagnetic material is reduced in dimension. As the thickness is reduced, the ferromagnetic or antiferromagnetic material starts losing its inherent magnetic field, resulting in randomly aligned magnetic clusters. When the thickness is reduced below a certain value (typically less than 15 A° for a ferromagnetic material, and less than 50 A° for an antiferromagnetic material) the net magnetic moment of the randomly polarized magnetic clusters becomes zero, and the material is said to be superparamagnetic.

A nonmagnetic material doped with ferromagnetic materials as shown in FIG. 6B may also give rise to a net magnetic moment of zero, but under the influence of an external magnetic field, the ferromagnetic clusters can be easily polarized to align with the external field, at room temperature. A superparamagnetic layer may be formed using the technique illustrated in FIG. 6B. FIG. 6C shows a similar technique to form a superparamagnetic layer, by doping a ferromagnetic layer with nonmagnetic materials. FIG. 6D represents yet another method for forming a superparamagnetic layer, by using a laminated ferromagnetic/nonmagnetic multilayer. The superparamagnetic layer 402 in exemplary embodiments may be advantageously formed using techniques which include the techniques of FIGS. 6A-D.

Accordingly, disclosed embodiments with a composite free layer comprising a superparamagnetic layer advantageously exhibit reduced switching current density due to low saturation magnetization and enhancement of spin efficiency. Further, as compared to composite free layers which only include ferromagnetic materials, the disclosed composite free layer structures with a superparamagnetic layer contribute to enhanced thermal stability due to a stable domain structure. Moreover the larger volume of the disclosed composite free layer structures, as compared to conventional single layer free layer structures, also improves the thermal stability of the MTJ device.

Figure 7:
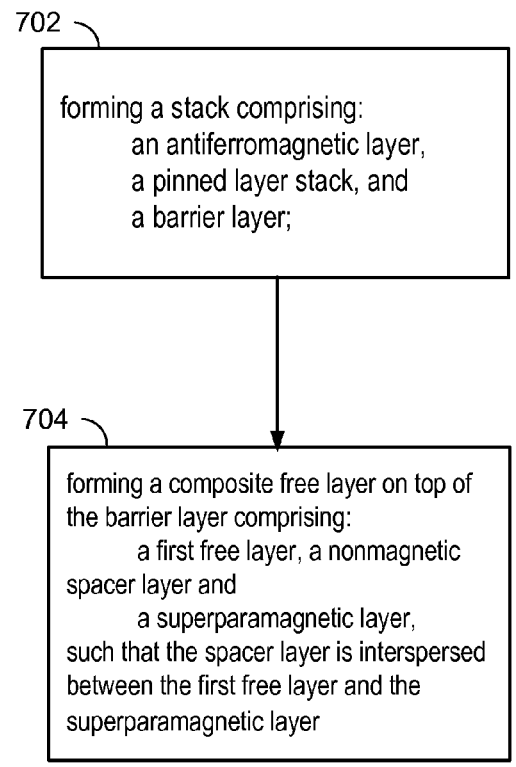
FIG. 7 illustrates a flowchart for forming a memory device.

It will be appreciated from the foregoing disclosure that embodiments can include various methods including those used to form the memory devices described herein. Accordingly, as illustrated in FIG. 7, an embodiment can include a method for forming a memory device having a magnetic tunnel junction (MTJ) storage element. A stack is formed (step 702) having an antiferromagnetic layer, a pinned layer stack and a barrier layer. A composite free layer is formed on top of the barrier layer (step 704). The composite free layer includes a first free layer, a nonmagnetic spacer layer and a superparamagnetic layer, such that the spacer layer is interspersed between the first free layer and the superparamagnetic layer. It will be appreciated that FIG. 7 and the foregoing description are not intended to limit the embodiments to the illustrated and expressly discussed feature. Embodiments can further include any of the additional steps/functionalities described herein.

It will be appreciated that memory devises including the MTJ storage elements described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory having MTJ storage elements as disclosed herein.

The foregoing disclosed devices and methods can be designed and can be configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A magnetic tunnel junction (MTJ) storage element comprising:
   a stack comprising a pinned layer and a barrier layer; and
   a composite free layer formed on the barrier layer, comprising a first free layer, a nonmagnetic spacer layer and a superparamagnetic layer, such that the spacer layer is interspersed between the first free layer and the superparamagnetic layer.

2. The MTJ storage element of claim 1, further comprising an interlayer exchange coupling between the first free layer and the superparamagnetic layer.

3. The MTJ storage element of claim 2, wherein a magnetic polarization of the first free layer is aligned parallel to a magnetic polarization of the superparamagnetic layer.

4. The MTJ storage element of claim 2, wherein a magnetic polarization of the first free layer is aligned anti-parallel to a magnetic polarization of the superparamagnetic layer.

5. The MTJ storage element of claim 1, further comprising an interlayer fringe coupling between the first free layer and the superparamagnetic layer.

6. The MTJ storage element of claim 5, wherein a magnetic polarization of the first free layer is aligned anti-parallel to a magnetic polarization of the superparamagnetic layer.

7. The MTJ storage element of claim 1, wherein the superparamagnetic layer is formed from a ferromagnetic layer of reduced thickness.

8. The MTJ storage element of claim 1, wherein the superparamagnetic layer is formed from an antiferromagnetic layer of reduced thickness.

9. The MTJ storage element of claim 1, wherein the superparamagnetic layer is formed from a nonmagnetic material doped with ferromagnetic elements.

10. The MTJ storage element of claim 1, wherein the superparamagnetic layer is formed from a ferromagnetic material doped with nonmagnetic elements.

11. The MTJ storage element of claim 1, wherein the superparamagnetic layer is formed from a laminated structure comprising one or more layers of ferromagnetic elements, interspersed with one or more layers of nonmagnetic elements.

12. The MTJ storage element of claim 1, further comprising an antiferromagnetic material in contact with the pinned layer, formed below the pinned layer.

13. The MTJ storage element of claim 1, wherein the pinned layer is a pinned layer stack comprising two or more layers.

14. The MTJ storage element according to claim 1, wherein the storage element is applied in an electronic device, selected from the group consisting of a set top box, music player, video player, entertainment unit, navigation device, communications device, personal digital assistant (PDA), fixed location data unit, and a computer, into which the MTJ storage element is integrated.

15. The MTJ storage element according to claim 1, wherein the storage element is integrated in a Spin Transfer Torque Magnetoresistive Random Access Memory (STT-MRAM).

16. The STT-MRAM device according to claim 15, wherein the STT-MRAM device is integrated in at least one semiconductor die.

17. A method of forming a magnetic tunnel junction (MTJ) storage element, the method comprising:
  forming a stack comprising a pinned layer and a barrier layer; and
  forming a composite free layer on top of the barrier layer comprising a first free layer, a nonmagnetic spacer layer and a superparamagnetic layer, such that the spacer layer is interspersed between the first free layer and the superparamagnetic layer.

18. The method of claim 17, further comprising coupling the first free layer and the superparamagnetic layer via interlayer exchange coupling.

19. The method of claim 18, wherein a magnetic polarization of the first free layer is aligned parallel to a magnetic polarization of the superparamagnetic layer.

20. The method of claim 18, wherein a magnetic polarization of the first free layer is aligned anti-parallel to a magnetic polarization of the superparamagnetic layer.

21. The method of claim 17, further comprising:
  coupling the first free layer the superparamagnetic layer via interlayer fringe coupling.

22. The method of claim 21, wherein a magnetic polarization of the first free layer is aligned anti-parallel to a magnetic polarization of the superparamagnetic layer.

23. The method of claim 17, wherein the superparamagnetic layer is formed by reducing the thickness of a ferromagnetic or antiferromagnetic layer.

24. The method of claim 17, wherein the superparamagnetic layer is formed by doping a nonmagnetic material with ferromagnetic elements.

25. The method of claim 17, wherein the superparamagnetic layer is formed by doping a ferromagnetic material with nonmagnetic elements.

26. The method of claim 17, wherein the superparamagnetic layer is formed by interspersing one or more layers of nonmagnetic elements with one or more layers of ferromagnetic elements.

27. The method according to claim 17, wherein the MTJ storage element is applied in an electronic device, selected from the group consisting of a set top box, music player, video player, entertainment unit, navigation device, communications device, personal digital assistant (PDA), fixed location data unit, and a computer, into which the MTJ storage element is integrated.

28. The method according to claim 17, wherein the MTJ storage element is integrated in a Spin Transfer Torque Magnetoresistive Random Access Memory (STT-MRAM).

29. A magnetic tunnel junction (MTJ) storage element comprising:
  a first magnetic means for holding a first polarization;
  a composite magnetic means for holding a second polarization comprising
    ferromagnetic means;
    superparamagnetic means; and
    nonmagnetic means interspersed between the ferromagnetic means and the superparamagnetic means, wherein a thickness of the nonmagnetic means controls a manner of coupling between the ferromagnetic means and the superparamagnetic means; and
  insulating means interspersed between the first magnetic means and composite magnetic means to enable a flow of tunneling current between the first magnetic means and the composite magnetic means.

30. The MTJ storage element of claim 29, wherein the manner of coupling between the ferromagnetic means and the superparamagnetic means is interlayer exchange coupling.

31. The MTJ storage element of claim 30, wherein a magnetic polarization of the ferromagnetic means is aligned parallel to a magnetic polarization of the superparamagnetic means.

32. The MTJ storage element of claim 30, wherein a magnetic polarization of the ferromagnetic means is aligned anti-parallel to a magnetic polarization of the superparamagnetic means.

33. The MTJ storage element of claim 29, wherein the manner of coupling between the ferromagnetic means and the superparamagnetic means is interlayer fringe coupling.

34. The MTJ storage element of claim 33, wherein a magnetic polarization of the ferromagnetic means is aligned anti-parallel to a magnetic polarization of the superparamagnetic means.

35. The MTJ storage element of claim 29, wherein the superparamagnetic means is formed from a ferromagnetic or anti-ferromagnetic material of reduced thickness.

36. The MTJ storage element of claim 29, wherein the superparamagnetic means is formed from a nonmagnetic material doped with ferromagnetic elements.

37. The MTJ storage element of claim 29, wherein the superparamagnetic means is formed from a ferromagnetic material doped with nonmagnetic elements.

38. The MTJ storage element of claim 29, wherein the superparamagnetic means is formed from a laminated structure comprising one or more layers of ferromagnetic elements, interspersed with one or more layers of nonmagnetic elements.

39. The MTJ storage element according to claim 29, wherein the MTJ storage element is applied in an electronic device, selected from the group consisting of a set top box, music player, video player, entertainment unit, navigation device, communications device, personal digital assistant (PDA), fixed location data unit, and a computer, into which the MTJ storage element is integrated.

40. The MTJ storage element according to claim 29, wherein the MTJ storage element is integrated in a Spin Transfer Torque Magnetoresistive Random Access Memory (STT-MRAM).

41. A method of forming a magnetic tunnel junction (MTJ) storage element, the method comprising:
   step for forming a stack comprising a pinned layer and a barrier layer; and
   step for forming a composite free layer on top of the barrier layer comprising a first free layer, a nonmagnetic spacer layer and a superparamagnetic layer, such that the spacer layer is interspersed between the first free layer and the superparamagnetic layer.

42. The method of claim 41, further comprising coupling the first free layer and the superparamagnetic layer via interlayer exchange coupling.

43. The method of claim 42, wherein a magnetic polarization of the first free layer is aligned parallel to a magnetic polarization of the superparamagnetic layer.

44. The method of claim 42, wherein a magnetic polarization of the first free layer is aligned anti-parallel to a magnetic polarization of the superparamagnetic layer.

45. The method of claim 41, further comprising coupling the first free layer the superparamagnetic layer via interlayer fringe coupling.

46. The method of claim 45, wherein a magnetic polarization of the first free layer is aligned anti-parallel to a magnetic polarization of the superparamagnetic layer.

47. The method of claim 41, wherein the superparamagnetic layer is formed by reducing the thickness of a ferromagnetic or antiferromagnetic layer.

48. The method of claim 41, wherein the superparamagnetic layer is formed by doping a nonmagnetic material with ferromagnetic elements.

49. The method of claim 41, wherein the superparamagnetic layer is formed by doping a ferromagnetic material with nonmagnetic elements.

50. The method of claim 41, wherein the superparamagnetic layer is formed by interspersing one or more layers of nonmagnetic elements with one or more layers of ferromagnetic elements.

51. The method according to claim 41, wherein the MTJ storage element is applied in an electronic device, selected from the group consisting of a set top box, music player, video player, entertainment unit, navigation device, communications device, personal digital assistant (PDA), fixed location data unit, and a computer, into which the MTJ storage element is integrated.

52. The method according to claim 41, wherein the MTJ storage element is integrated in a Spin Transfer Torque Magnetoresistive Random Access Memory (STT-MRAM).

* * * * *